(12) United States Patent
Chen et al.

(10) Patent No.: US 12,167,562 B2
(45) Date of Patent: Dec. 10, 2024

(54) GUIDERAIL FIXING STRUCTURE

(71) Applicant: Phoenix Contact Asia-Pacific (Nanjing) Co., Ltd., Nanjing (CN)

(72) Inventors: Lei Chen, Nanjing (CN); Chaozhong Gao, Nanjing (CN)

(73) Assignee: Phoenix Contact Asia-Pacific (Nanjing) CO., LTD., Nanjing (CN)

( * ) Notice: Subject to any disclaimer, the term of this patent is extended or adjusted under 35 U.S.C. 154(b) by 221 days.

(21) Appl. No.: 17/777,932

(22) PCT Filed: Nov. 24, 2020

(86) PCT No.: PCT/CN2020/131011
§ 371 (c)(1),
(2) Date: May 18, 2022

(87) PCT Pub. No.: WO2021/109895
PCT Pub. Date: Jun. 10, 2021

(65) Prior Publication Data
US 2022/0418142 A1     Dec. 29, 2022

(30) Foreign Application Priority Data
Dec. 4, 2019   (CN) .......................... 201911224784.5

(51) Int. Cl.
*H05K 7/14*         (2006.01)
(52) U.S. Cl.
CPC .................. *H05K 7/1474* (2013.01)
(58) Field of Classification Search
CPC .............. A47B 88/423; H05K 7/1474
See application file for complete search history.

(56) References Cited

U.S. PATENT DOCUMENTS 9,444,231 B2 *    9/2016  Ho .................... H02B 1/0523
10,194,551 B2 *   1/2019  Nicoloff ................ H05K 1/181
(Continued)

FOREIGN PATENT DOCUMENTS

CN       204900552 U      12/2015
CN       207199517 U       4/2018
(Continued)

OTHER PUBLICATIONS

International Search Report and Written Opinion of International Application No. PCT/CN2020/131011, and partial English translation thereof, dated Feb. 21, 2021, 10 pp.

*Primary Examiner* — Daniel J Rohrhoff
(74) *Attorney, Agent, or Firm* — Shumaker & Sieffert, P.A.

(57) ABSTRACT

Provided in the present disclosure is a guiderail fixing structure. The guiderail fixing structure comprises: a housing; a transverse fixing component, arranged at the bottom part of the housing, being two mounting stands provided opposite each other, and used for implementing transverse fixing between a guiderail and the housing; and a vertical fixing component, arranged at the bottom part of the housing and within the two mounting stands provided opposite each other, and used for implementing vertical fixing between the guiderail and the housing. The vertical fixing component comprises engaging hooks and an engaging hook part. When the vertical fixing component is employed, the engaging hooks of the vertical fixing component used for engaging are arranged outside of either edge of the guiderail, and the engaging hook part of the vertical fixing component is arranged within the guiderail.

15 Claims, 6 Drawing Sheets

(56) References Cited

U.S. PATENT DOCUMENTS

| | | | | |
|---|---|---|---|---|
| 10,794,533 B1* | 10/2020 | Correll | ............. | H05K 7/14 |
| 2011/0269339 A1* | 11/2011 | Baran | ............. | H05K 7/1474 |
| | | | | 439/532 |
| 2011/0306219 A1* | 12/2011 | Swanger | ............. | H05K 3/325 |
| | | | | 439/55 |
| 2012/0012384 A1* | 1/2012 | Chang | ............. | G06F 1/188 |
| | | | | 248/223.41 |
| 2021/0212460 A1* | 7/2021 | Chen | ............. | A47B 88/423 |

FOREIGN PATENT DOCUMENTS

| | | |
|---|---|---|
| CN | 110381719 A | 10/2019 |
| CN | 211509602 U | 9/2020 |

\* cited by examiner

GUIDERAIL FIXING STRUCTURE

This application is a national stage entry under 35 U.S.C. § 371 of International Application No. PCT/CN2020/131011, filed Nov. 24, 2020 and entitled "GUIDERAIL FIXING STRUCTURE," which claims the benefit of and priority to CN Application No. 201911224784.5, filed Dec. 4, 2019 and entitled "GUIDERAIL FIXING STRUCTURE," the entire contents of each of which are incorporated herein by reference.

TECHNICAL FIELD

The disclosure relates to the field of electrical connection, and pertains to a guiderail fixing structure.

BACKGROUND

Industrial electrical module products are generally to be fixed on standard DIN guiderail. Generally, electrical modules can only be mounted transversely or vertically, but cannot be compatible for mounting in both directions. When the on-site wiring approach is complex and the cabinet space is limited, it is very unfavorable to users.

There is usually a detaching opening disposed at the bottom of the electrical module. When the electrical module product is to be disassembled from the guiderail, it is necessary, during the detaching process, to insert a screwdriver into the detaching opening, actuate the screwdriver, and take out the electrical module from the guiderail with the other hand. Detaching the electrical module in this way is inconvenient.

During use, the relevant mechanism for mounting is usually located outside the guiderail, which increases the size of the product and cannot satisfy the use of the product in the situation of limited mounting space. During use, the related engaging hooks usually cannot be detached, occupying a lot of space and materials, and thus the purpose of cost reduction cannot be achieved.

SUMMARY

The purpose of the present disclosure is to provide a device that can be mounted in two directions, and during the guiderail mounting, hook head(s) of the vertical fixing component for engaging purpose is located outside of either side of the guiderail, and engaging hook part of the vertical fixing component is located within the guiderail, thus reducing the space required for mounting module.

A guiderail fixing structure, comprises: a housing; a transverse fixing component, arranged at the bottom part of the housing, being two mounting feet provided opposite to each other, and is to be used for implementing transverse fixing between the guiderail and the housing; and a vertical fixing component, arranged at the bottom part of the housing and within the two mounting feet provided opposite to each other, and is to be used for implementing vertical fixing between the guiderail and the housing; the vertical fixing component comprises hook heads and a engaging hook part. When the vertical fixing component is being adapted, the hook head(s) of the vertical fixing component for engaging purpose is arranged outside of either edge of the guiderail, and the engaging hook part of the vertical fixing component is arranged within the guiderail.

As can be seen from the above technical contents, the beneficial effects of the present disclosure are as follows: since the mounting of the guiderail along different directions is enabled, it is possible, during use, to realize mountings compatible for different usage conditions and usage states. The hook head of the vertical fixing component for engaging purpose may be arranged outside of either edge of the guiderail, and the engaging hook part of the vertical fixing component may be arranged within the guiderail, in this way, this solution can make the most use of the space to be mounted inside the guiderail, thereby reducing the size of the housing and adapting to more use scenarios, and enable mounting more products within less space, which saves the costs.

The mounting foot of the lateral fixing component is a detachable part, which can be divided into a fixed portion and a detachable-foot portion, wherein the fixed portion and the housing are integrated, the detachable-foot is to be mounted on the fixed portion, and the transverse mounting of the parts on the housing can be realized by simply mounting or detaching the detachable-foot, and when the vertical mounting is desired, the detachable-foot can be detached, and the relevant components can be returned, thereby saving the costs.

It is to be understood that all combinations of the foregoing concepts, as well as additional concepts described in greater detail below, are considered to be a part of the inventive subject matters of the present disclosure as long as such concepts are not contradictory to each other. Additionally, all combinations of the claimed subject matters are considered to be a part of the inventive subject matter of the present disclosure.

The foregoing and other aspects, embodiments and features of the teachings of the present disclosure can be more fully understood from the following description when taken in conjunction with the accompanying drawings. Other additional aspects of the present disclosure, such as features and/or benefits of the exemplary embodiments, will be apparent from the description below, or learned by practice of specific embodiments in accordance with the teachings of the present disclosure.

BRIEF DESCRIPTION OF DRAWINGS

The accompanying drawings are not intended to be drawn to scale. In the accompanying drawings, each of the identical or nearly identical components that are illustrated in various figures may be represented by the same reference numeral. For clarity, not every component is labeled in every figure. Embodiments of various aspects of the present disclosure will now be described by way of examples and with reference to the drawings, wherein.

Figure 1:
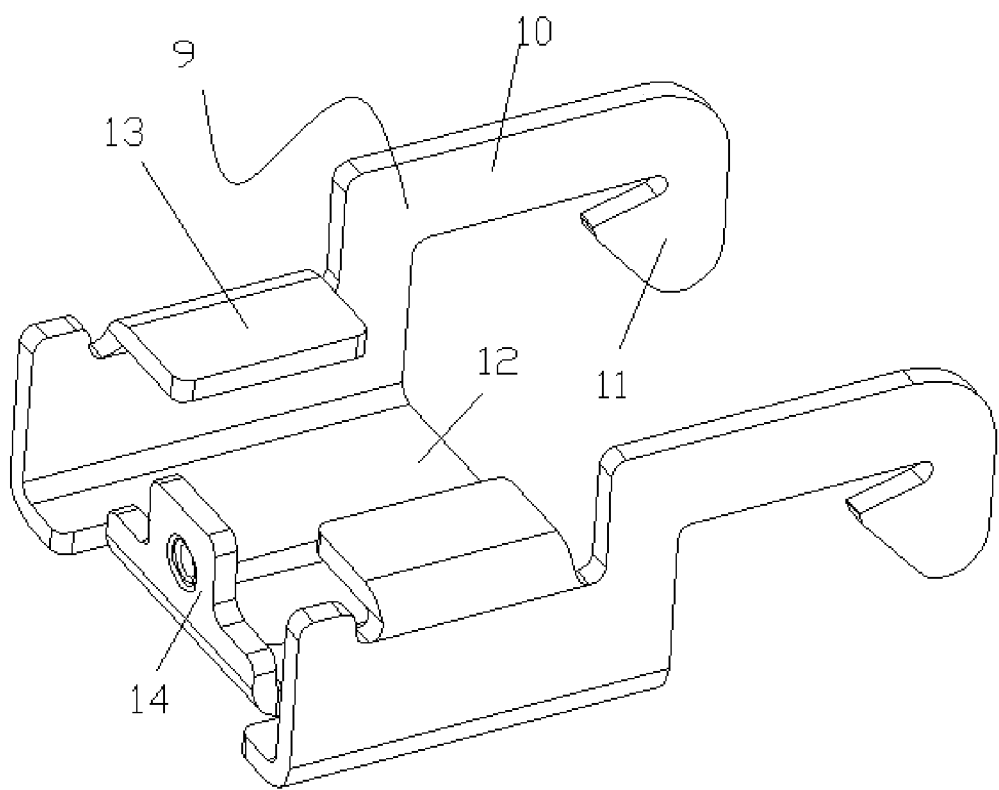
FIG. 1 is a schematic structural diagram of a frame component of the present disclosure.

The names corresponding to the relevant reference numerals in the figures are: 1. housing, 2. fixing component, 3. groove, 4. engaging groove, 5. engaging hook mounting groove, 6. first groove body, 7. second groove body, 8. mounting part, 9. frame component, 10. engaging hook connecting edge, 11. hook head, 12. connecting edge, 13.

L-shaped lateral side, 14. second connecting edge, 15. fixed engaging hook, 16. detachable-food portion, 17. first leg portion, 18. second leg portion, 19. raised portion, 20. connecting rod, 21. engaging edge, 22. guiderail.

DETAILED DESCRIPTION

In order to better understand the technical contents of the present disclosure, specific embodiments are given and described below in conjunction with the accompanying drawings.

Aspects of the disclosure are described in the present disclosure with reference to the accompanying drawings, in which a number of illustrative embodiments are shown. Embodiments of the present disclosure are not necessarily intended to include all aspects of the present disclosure. It should be understood that the various concepts and embodiments described above, as well as those described in greater detail below, can be implemented in any of a number of ways, as the concepts and embodiments disclosed herein are not limited to any implementation. Additionally, some aspects disclosed herein may be used alone or in any suitable combination with other aspects disclosed herein.

Those skilled in the art will recognize that the various embodiments may be practiced without one or more of the specific details or with other alternative and/or additional methods, materials or components. In other instances, well-known structures, materials, or operations are not shown or described in detail so as not to obscure aspects of the various embodiments of the present disclosure. Similarly, for purposes of explanation, specific quantities, materials and configurations are set forth in order to provide a thorough understanding of the embodiments of the present disclosure. However, the present disclosure may be practiced without the specific details. Furthermore, it is to be understood that the various embodiments shown in the drawings are illustrative representations and are not necessarily drawn to scale.

As shown in FIG. 1 to FIG. 5, a fixing structure for a guiderail 22 comprises: a housing 1; a transverse fixing component 2, arranged at the bottom part of the housing 1, being two mounting feet provided opposite to each other, and intended for implementing transverse fixing between the guiderail 22 and the housing 1; a vertical fixing component, arranged at the bottom part of the housing 1 and within the two mounting feet provided opposite each other, and intended for implementing vertical fixing between the guiderail 22 and the housing 1; the vertical fixing component comprises a hook head 11 and an engaging hook part, wherein when the vertical fixing component is being adapted, the hook head(s) 11 of the vertical fixing component for engaging purpose is arranged outside of either edge of the guiderail 22, and the engaging hook part of the vertical fixing component is arranged within the guiderail 22.

Further, the hook heads 11 of the vertical fixing component are two ones provided opposite to each other, and one of which is a fixed engaging hook 15 fixed on the bottom of the housing 1, and the other hook head 11 is a movable engaging hook that can move.

The movable engaging hook is to be connected with the mounting part 8 provided on the housing 1, so that the movable engaging hook can be moved with the frame component 9 as a whole.

As shown in FIG. 1, the frame component 9 includes symmetrically arranged L-shaped lateral sides 13 and a connecting edge 12 connecting the two L-shaped lateral sides 13. A second connecting edge 14 bent in the direction towards the bottom of the housing 1 is provided on an end face of the connecting edge 12, said end face being away from the end where the hook heads 11 are provided. An engaging hook connecting edge 10 extends at a side of the L-shaped lateral side 13 that is perpendicular to the housing 1. The engaging hook connecting edge 10 is integrally formed with the hook head 11. The frame component 9 is provided thereon with an elastic member mounting cavity, and the elastic member mounting cavity is intended for placing an elastic member into the chamber enclosed by the second connecting edge 14 and the mounting part 8. The mounting part 8 is a part protruding from the bottom surface of the housing 1, a first groove body 6 for accommodating the L-shaped lateral side 13 is provided between the bottom of the part and the bottom surface of the housing 1, the upper portion of the part is provided with a second groove body 7 for accommodating the second connecting edge 14, and the inner surface of the second groove body 7 and the inner surface of the second connecting edge 14 form a cavity for accommodating the elastic member.

Figure 2:
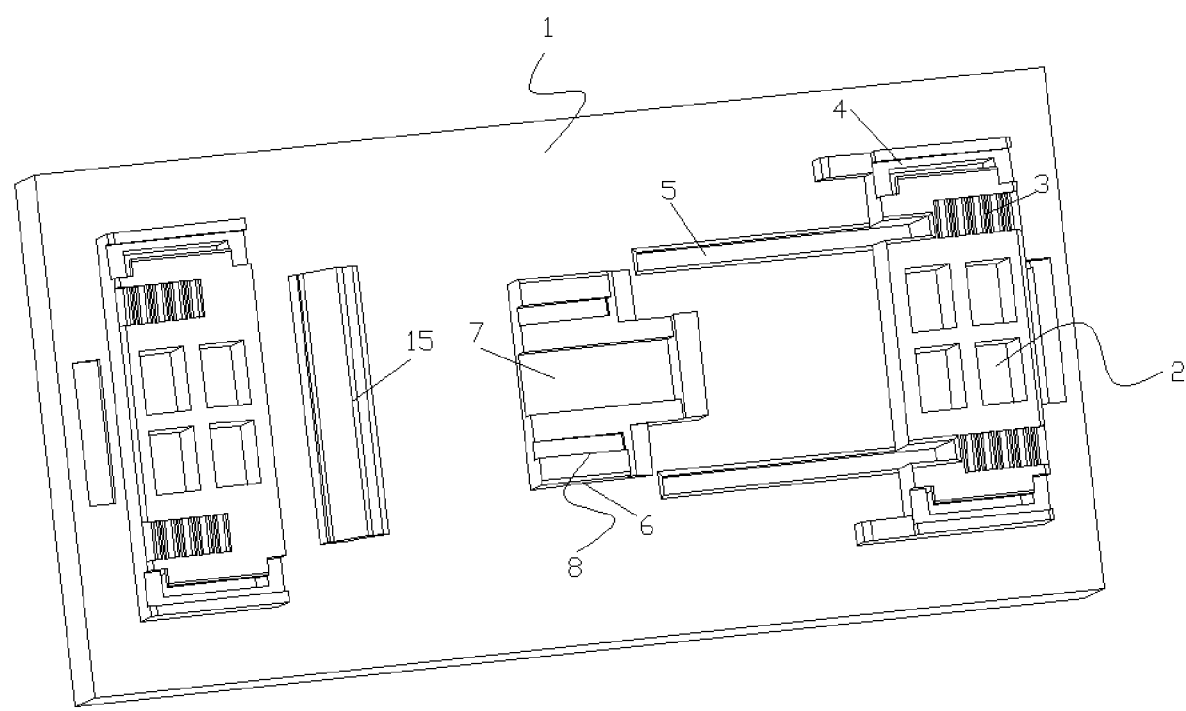
FIG. 2 is a schematic structural diagram of a housing according to Embodiment 1 of the present disclosure.
Figure 6:
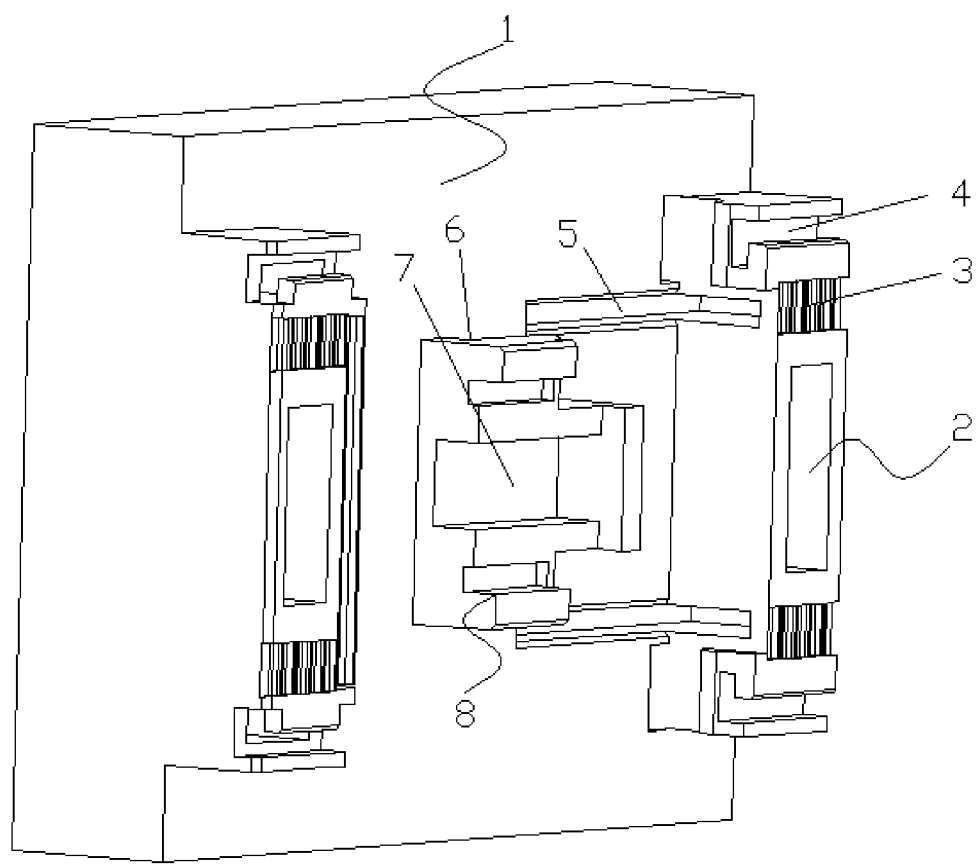
FIG. 6 is a schematic structural diagram of a housing according to Embodiment 2 of the present disclosure.

The movable engaging hook is to be disposed in the engaging hook mounting groove 5 provided in the housing 1, and the bottom surface of the engaging hook mounting groove 5 is not in the same plane as the bottom surface of the fixed engaging hook 15. During the implementation, two different situations may be expressed as follows. As shown in FIG. 2, one of the implementations is that the front end face of the engaging hook mounting groove 5 does not penetrate the housing 1. As shown in FIG. 6, when the size of the housing 1 is smaller, in order to satisfy the mounting requirements, the front end face of the engaging hook mounting groove 5 penetrates the housing 1. During the mounting process, with reference to the structure as shown in FIG. 2, the engaging hook connecting edge 10 is to be placed into the engaging hook mounting groove 5, the hook head 11 is moved towards the fixed engaging hook 15, and when the engaging hook connecting edge 10 is moved to a defined position, the inner surface of the second groove body 7 and the inner surface of the second connecting edge 14 form a chamber for accommodating an elastic member, and the elastic member is to be placed in the chamber through the elastic member mounting cavity provided on the frame component 9, so that the frame component 9 is connected with the housing 1. Due to the length of the engaging hook mounting groove 5, when the engaging hook 11 is passed through the engaging hook mounting groove 5 which penetrates the housing 1, the hook head 11 is located outside the housing 1, and the hook head 11 is moved in the direction towards the fixed engaging hook 15, and when the engaging hook connecting edge 10 is moved to a limited position, the inner surface of the second groove body 7 and the inner surface of the second connecting edge 14 form a chamber for accommodating the elastic member, and the elastic member is placed into the chamber through the elastic member mounting cavity provided on the frame component 9, so as to connect the frame component 9 and the housing 1 together.

Figure 5:
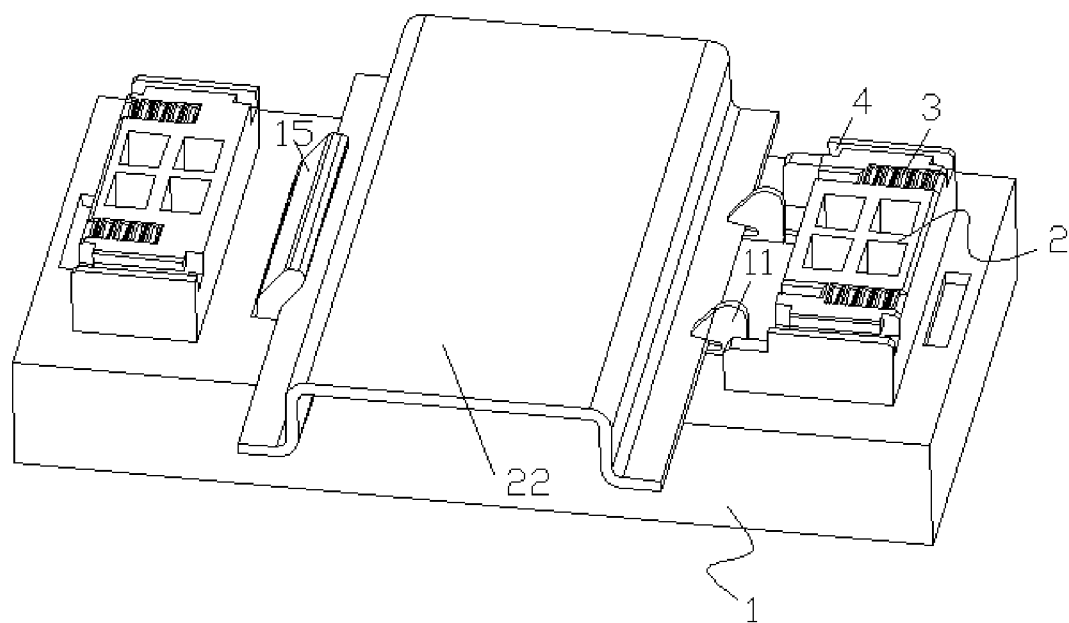
FIG. 5 is a schematic structural diagram in a vertical mounting state according to the present disclosure.

As shown in FIG. 2 or FIG. 5, the mounting foot of the traverse fixing component 2 is a detachable part, which can be divided into a fixed portion and a detachable-foot portion 16, wherein the fixed portion and the housing 1 are integrated, and the detachable-foot 16 is mounted on the fixed portion, and the detachable-foot is provided thereon with two clamping portions to be connected with the guiderail 22, and the guiderail 22 is mounted within the two clamping portions.

Figure 3:
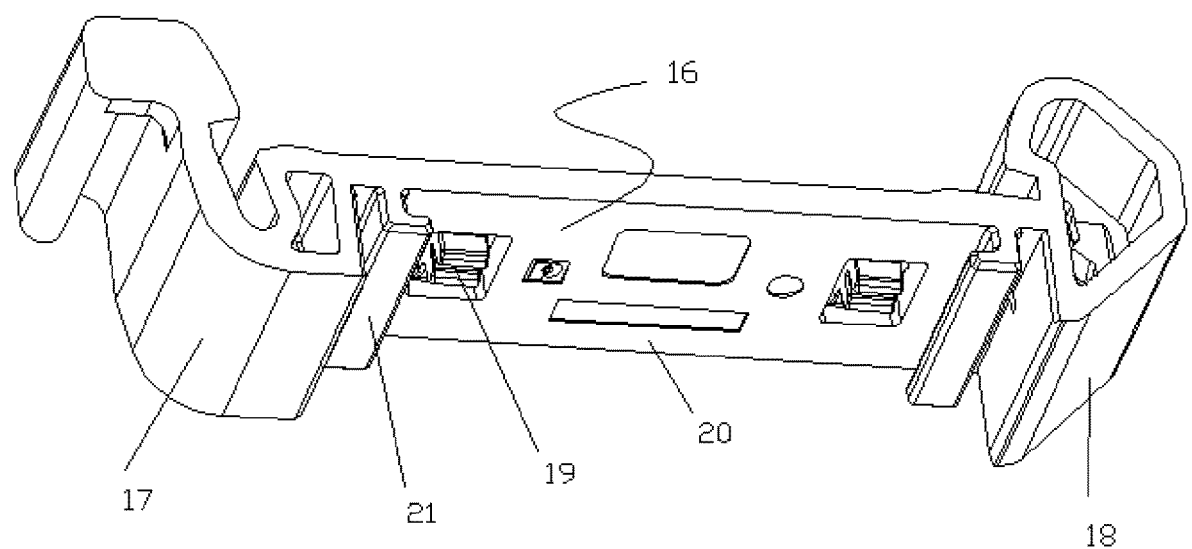
FIG. 3 is a schematic structural diagram of a detachable-foot portion of the present disclosure.
Figure 4:
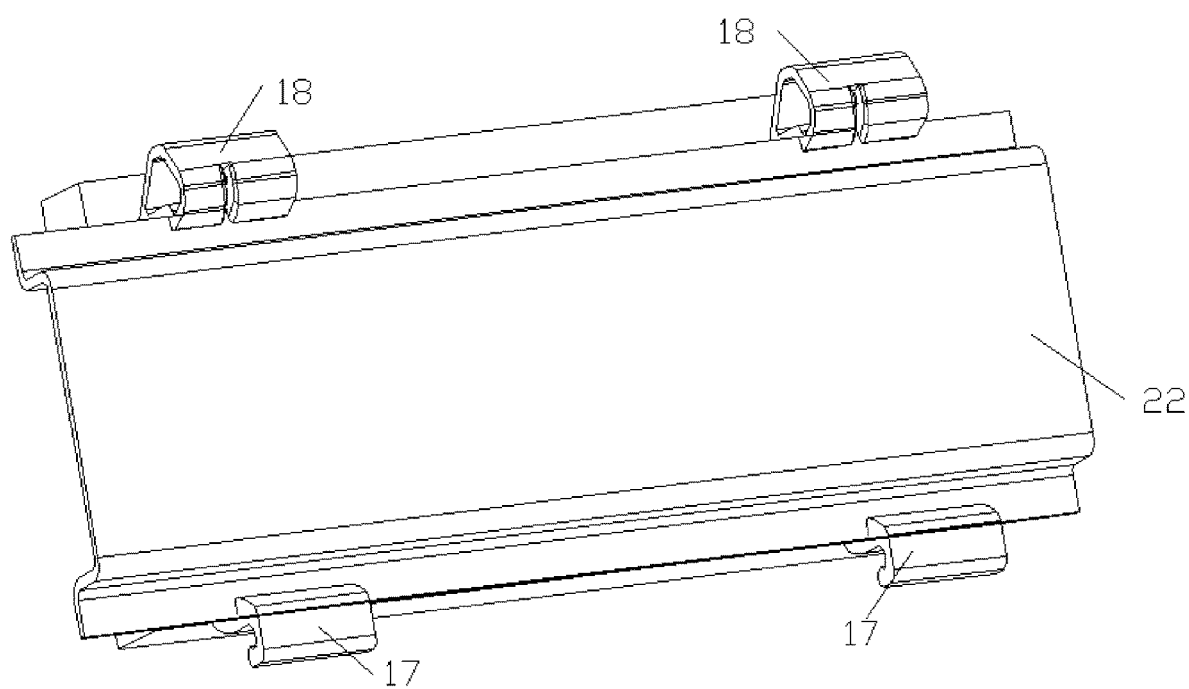
FIG. 4 is a schematic structural diagram in a transverse mounting state according to the present disclosure.

As shown in FIG. 3, the detachable-foot portion 16 includes a first leg portion 17, a second leg portion 18, and a connecting rod 20 connecting the first leg portion 17 and the second leg portion 18, and the bottom of the connecting rod 20 is provided with two engaging edges 21 that are to be connected with the fixed portions. The engaging edge 21 is used for mating with the engaging groove 4 provided on the fixed portion, thereby enabling the connection between the detachable-foot portion 16 and the fixed portion.

The detachable-foot portion 16 includes a first leg portion portion 17, a second leg portion portion 18, and a connecting rod 20 connecting the first leg portion portion 17 and the second leg portion portion 18. The bottom of the connecting rod 20 is provided with two engaging edges 21 used for mating with the engaging groove 4 provided on the fixed portion, thereby enabling the connection between the detachable-foot portion 16 and the fixed portion.

A plurality of raised portions 19 are provided between the engaging edges 21, and the raised portion 19 is to be mated with the groove 3 provided on the fixed portion, thereby enabling fixing of the detachable-foot portion 16 and the fixed portion in the left-right direction.

The foregoing description of the present disclosure is provided to enable any person skilled in the art to practice or use the present disclosure. Various modifications to this disclosure will be readily apparent to those skilled in the art, and the generic principles defined herein may be applied to other variations without departing from the spirit or scope of the present disclosure. Thus, the present disclosure is not intended to be limited to the examples and designs described in the specification, instead, it shall be granted a broadest scope consistent with the principles and novel features disclosed herein.

As can be seen from the above technical solutions, since the guiderail 22 can be mounted onto along different directions, mountings applicable to different usage conditions and usage states can be realized during use. The hook head 11 of the vertical fixing component for engaging purpose may be arranged outside of either edge of the guiderail 22, and the engaging hook part of the vertical fixing component may be arranged within the guiderail 22, thus reducing the size of the housing 1. Thus it is possible to be compatible with more use scenarios and to install more products within less space, which saves the cost.

The mounting foot of the traverse fixing component 2 is a detachable part, which can be divided into a fixed portion and a detachable-foot portion 16, wherein the fixed portion and the housing 1 are integrated, and the detachable-foot portion 16 is to be mounted on the fixed portion. A traverse mounting of the parts on the housing 1 can be enabled simply by mounting or detaching the detachable-foot portion 16. When vertical mounting is desired, the detachable-foot 16 can be detached and the relevant components can be returned, thereby saving the costs.

Although the present disclosure has been disclosed above with preferred embodiments, it is not intended to limit the present disclosure. Those skilled in the art to which the present disclosure pertains can make various changes and modifications without departing from the spirit and scope of the present disclosure. Therefore, the protection scope of the present disclosure should be determined from the claims.

What is claimed is:

1. A guiderail fixing structure configured to be mounted onto a guiderail having two opposite edges along two different directions, the guiderail fixing structure comprising:

a housing;

a transverse fixing component arranged at a bottom part of the housing, the transverse fixing component being two mounting feet provided opposite to each other and configured for implementing transverse fixing between the guiderail and the housing that mounts the housing onto the guiderail along a first direction; and a vertical fixing component arranged at the bottom part of the housing and within the two mounting feet provided opposite to each other, the vertical fixing component configured for implementing vertical fixing between the guiderail and the housing that mounts the housing onto the guiderail along a second direction different from the first direction, wherein the vertical fixing component comprises a hook head and an engaging hook part, wherein when the vertical fixing component is being adapted, the hook head of the vertical fixing component for engaging purpose is arranged outside of either of the edges of the guiderail and the engaging hook part of the vertical fixing component is arranged within the guiderail.

2. The guiderail fixing structure according to claim 1, wherein the hook head of the vertical fixing component comprises a fixed engaging hook which is fixed at the bottom of the housing and a movable engaging hook provided opposite of the fixed engaging hook.

3. The guiderail fixing structure according to claim 2, wherein the movable engaging hook is configured to be disposed in an engaging hook mounting groove provided in the housing, and wherein a bottom surface of the engaging hook mounting groove is in a different plane than a plane of a bottom surface of the fixed engaging hook.

4. The guiderail fixing structure according to claim 3, wherein the movable hook head is integrated with a frame component configured to move the movable hook head, and wherein the frame component is configured to be connected with a mounting part provided on the housing.

5. The guiderail fixing structure according to claim 2, wherein the movable hook head is integrated with a frame component configured to move the movable hook head, and wherein the frame component is configured to be connected with a mounting part provided on the housing.

6. The guiderail fixing structure according to claim 5, wherein the frame component comprises symmetrically arranged L-shaped lateral sides, a connecting edge connecting the two L-shaped lateral sides, a second connecting edge bent in a direction towards the bottom of the housing provided on an end face of the connecting edge that is away from the end where the engaging hook is provided, and an engaging hook connecting edge extending at one end of the L-shaped lateral sides, wherein the engaging hook connecting edge is integrally formed with the engaging hook, the frame component is provided thereon with an elastic member mounting cavity, and the elastic member mounting cavity is configured to place an elastic member into a chamber enclosed by the second connecting edge and the mounting part.

7. The guiderail fixing structure according to claim 6, wherein the mounting part is a part protruding from the bottom surface of the housing, wherein a first groove body configured for accommodating the L-shaped lateral side is provided between the bottom of the part and the bottom surface of the housing, wherein the upper portion of the part is provided with a second groove body configured for accommodating the second connecting edge, and wherein the inner surface of the second groove body and the inner surface of the second connecting edge form a cavity configured for accommodating an elastic member.

8. The guiderail fixing structure according to claim 7, wherein the mounting foot of the transverse fixing component is a detachable part, wherein the mounting foot is divided into a fixed part and a detachable-foot portion, wherein the fixed part is integral with the housing, wherein the detachable-foot portion is configured to be mounted on the fixed portion, wherein the detachable-foot portion is provided with two clamping portions configured to be connected with the guiderail, and wherein the guiderail is configured to be mounted within the two clamping portions.

9. The guiderail fixing structure according to claim 6, wherein the mounting foot of the traverse fixing component is a detachable part which is divided into a fixed portion and a detachable-foot portion, wherein the fixed portion is integral with the housing, wherein the detachable-foot portion is configured to be mounted on the fixed portion, wherein the detachable-foot portion is provided thereon with two clamping portions to be connected with the guiderail, and wherein the guiderail is configured to be mounted within the two clamping portions.

10. The guiderail fixing structure according to claim 9, wherein the detachable-foot portion includes a first leg portion, a second leg portion, and a connecting rod connecting the first leg portion and the second leg portion, wherein a bottom of the connecting rod is provided with two engaging edges that are configured to be connected with the two fixed portions, and wherein the engaging edge is configured to mate with an engaging groove provided on the fixed portion, thereby enabling the connection between the detachable-foot portion and the fixed portion.

11. The guiderail fixing structure according to claim 10, wherein a plurality of raised portions are provided between the engaging edges, and wherein the raised portion is configured to mate with the engaging groove provided on the fixed portion, thereby enabling fixing of the detachable stand portion and the fixed portion in the left-right direction.

12. The guiderail fixing structure according to claim 1, wherein the mounting foot of the traverse fixing component is a detachable part which is divided into a fixed portion and a detachable-foot portion, wherein the fixed portion and the housing are integrated, wherein the detachable-foot portion is to be mounted on the fixed portion, wherein the detachable-foot portion is provided thereon with two clamping portions configured to be connected with the guiderail, and wherein the guiderail is configured to be mounted within the two clamping portions.

13. The guiderail fixing structure according to claim 12, wherein the detachable-foot portion includes a first leg portion, a second leg portion, and a connecting rod connecting the first leg portion and the second leg portion, wherein a bottom of the connecting rod is provided with two engaging edges that are configured to be connected with the two fixed portions, and wherein the engaging edge is configured to mate with an engaging groove provided on the fixed portion, thereby enabling the connection between the detachable-foot portion and the fixed portion.

14. The guiderail fixing structure according to claim 13, wherein a plurality of raised portions are provided between the engaging edges, and wherein the raised portion is configured to mate with the engaging groove provided on the fixed portion, thereby enabling fixing of the detachable stand portion and the fixed portion in the left-right direction.

15. The guiderail fixing structure according to claim 1, wherein, when the transverse fixing is implemented, the two mounting feet are clamped onto the guiderail at two different positions along a length of the guiderail.

* * * * *